United States Patent [19]

Zarnoch et al.

[11] Patent Number: 4,695,489

[45] Date of Patent: Sep. 22, 1987

[54] ELECTROLESS NICKEL PLATING COMPOSITION AND METHOD

[75] Inventors: Kenneth P. Zarnoch, Scotia; Charles D. Iacovangelo, Schenectady, both of N.Y.

[73] Assignee: General Electric Company, Schenectady, N.Y.

[21] Appl. No.: 890,050

[22] Filed: Jul. 28, 1986

[51] Int. Cl.$^4$ ............................................. C23C 18/34
[52] U.S. Cl. ...................................... 427/438; 427/98
[58] Field of Search ................................ 427/438, 98

[56] References Cited

U.S. PATENT DOCUMENTS

| | | | |
|---|---|---|---|
| 3,915,716 | 10/1975 | Haack | 106/1.22 |
| 3,935,345 | 1/1976 | Lema | 427/438 |
| 4,407,860 | 10/1983 | Fleming | 427/98 |
| 4,590,095 | 5/1986 | Park | 427/96 |

OTHER PUBLICATIONS

Simpson, "Hydrazine: A Powerful Metal Reductant" Metal Finishing; Apr. 1985, pp. 57–60.
Kaiser et al., "A Fabrication Technique . . . ", Solid State Technology/May 1972, pp. 35–40.
Haddad et al., "Activation of Catalyst for Electroless Plating on Molybdenum", IBM TDB vol. 19, No. 3, Aug. 1976, p. 929.
Baudrand, "Electroless Nickel Plating on Metallized Ceramic" Plating and Surface Finishing, Sep. 1981, pp. 67–70.
V. M. Gershov et al., *Temperature Activation of Chemical Nickel–Plating in Hydrazine Solutions,* Russian Engineering Journal, vol. 53, No. 10, pp. 73–74.
V. M. Gershov et al., *Intensification of the Chemical Nickel–Plating Process in Hydrazine Containing Solutions,* Russian Engineering Journal, vol. 58, No. 5, pp. 37–38.
D. J. Levy, *Thin Nickel Films by Hydrazine Autocatalytic Reduction,* Electrochemical Technology, Jan.–Feb. 1963, pp. 38–42.
J. Dini et al., *Thick Nickel Deposits of High Purity by Electroless Methods,* Plating, Apr. 1967, pp. 385–390.

*Primary Examiner*—John D. Smith
*Attorney, Agent, or Firm*—Francis T. Coppa; James C. Davis, Jr.; James Magee, Jr.

[57] ABSTRACT

A method of applying nickel directly to a non-activated tungsten surface is disclosed, in which the tungsten surface is immersed in an aqueous electroless nickel plating bath containing a water-soluble nickel salt; ethylenediaminetetraacetic acid; hydrazine; and monoethanolamine for a period of time sufficient to deposit a layer of nickel on the tungsten surface.

3 Claims, No Drawings

ELECTROLESS NICKEL PLATING COMPOSITION AND METHOD

BACKGROUND OF THE INVENTION

This invention relates to the coating of metal substrates with nickel as, for example, is required in the preparation of ceramic carriers employed in the packaging of semiconductor chips.

The increased performance and circuit/bit densities of today's semiconductor chips require corresponding technological advancements in chip packaging. Since the introduction of the leadless ceramic chip carrier, the chip carrier packaging concept has seen increasing use. Ceramic chip carriers typically make use of alumina-based substrates and have discrete areas of multi-layer metallization bonded to the ceramic substrate. These areas of metallization comprise in sequence (a) a base metallization layer bonded to the ceramic substrate, (b) a layer of nickel bonded to the initial, or base, layer and (c) a layer of gold bonded to the nickel layer. As a practical matter tungsten is the metal of choice for the base metallization, although the use of molybdenum has been reported by one manufacturer for internal consumption.

In the typical fabrication of multi-layer ceramic substrates, alumina powder is mixed with glass frit and organic chemicals to form a slurry. This slurry is cast into sheets having a controlled thickness, which sheets are then blanked into various sizes and shapes, and via holes are punched. These green sheets are then screen printed with a metal such as tungsten or molybdenum to form the base metallization. These metallized green sheets are stacked, and laminated together, followed by cofiring, i.e., sintering, in hydrogen or a hydrogen-nitrogen mixture with the heating schedule usually peaking at 1550° C.–1650° C. Thereafter, these sintered substrates are processed to apply nickel metallization over the exposed discrete areas of sintered tungsten. This is followed in turn by gold metallization of the nickel surfaces. Actual compositions of the slurry and specifics of the processing can be expected to vary from manufacturer to manufacturer.

The tungsten metallization is usually about 10 microns thick and is very porous. The nickel layer applied thereto is typically about 2–5 microns thick, this layer being applied by either electrolytic or electroless nickel plating. The nickel functions both to aid in wire bonding and to provide a better thermal expansion match between the tungsten and gold layers on opposite sides thereof. Furthermore, the nickel layer functions as a surface to which a ceramic or metal lid may be attached. The thin layer of gold, typically about 1–2 microns thick, is applied to accommodate die attachment, wire bonding and sealing. It is important that the nickel and the gold metallizations contain as few pores as possible so that heremeticity can be achieved.

The sintered multi-layer ceramic bodies provided with the discrete areas of multi-layer metallization are subsequently subjected to brazing, chip joining and capping operations.

A high purity nickel deposit generally can be obtained by electrolytic plating. It is well known, however, that this process has several major drawbacks, including the following: (a) because of the need for an externally applied electrical current, it is often difficult to plate articles with complex shapes and circuitry; and (b) for the same reason, the nickel coating is generally very nonuniform, being thicker in well-exposed areas and substantially thinner at corners.

Because of these and other disadvantages of the electrolytic mode of plating, nickel metallization of ceramic chip carriers increasingly is carried out by electroless plating. This latter method can plate articles regardless of complexity of shape or circuitry with a relatively uniform coating thickness. This result is due to the fact that the tungsten surface is subjected to pretreatment, rendering the surface catalytic to the nickel deposition, and each unit area should be equally catalytic. Additionally, metals deposited electrolessly plate well into holes and around corners.

Unlike electrolytically deposited nickel, however, electrolessly deposited nickel typically contains a high level, usually in excess of 1 wt %, of boron or phosphorus. These impurities have been associated with the introduction of high internal stress in the nickel coatings. U.S. Pat. No. 4,407,860, issued to Fleming et al., discusses this problem and proposes a composition for the base metallization together with a post-coating treatment that purportedly provides stress-free pure nickel metallization.

Tungsten, as screen-printed and sintered on ceramic chip carriers, has not been found to be catalytic to the deposition of nickel thereon. Rendering of the discrete areas of tungsten catalytic is generally accomplished by depositing a material, e.g., palladium, on the tungsten surfaces to "activate" these substrate surfaces.

Electroless nickel plating compositions essentially consist of a nickel salt, a complexing agent, buffers, and a reducing agent. Nickel compositions which use as a reducing agent a hypophosphite or a borohydride or derivatives thereof do not allow the deposition of nickel on tungsten directly, i.e., without the use of surface activators. It is as a result of using such compositions that boron or phosphorus is embodied in the nickel as referred to hereinabove. Furthermore, while boron-containing reducing agents such as dimethylaminoborane (DMAB) are suitable when electrolessly plating nickel onto many substrates, they are relatively ineffective for plating nickel onto certain refractory metals, such as tungsten and molybdenum.

Certain prior art electroless plating compositions incorporate hydrazine compounds as the reducing agent in combination with ingredients other than those contained in the bath of the present invention. For example, Levy discloses a nickel-plating composition containing hydrazine as the reductant in *Electrochemical Technology*, Vol. 1, No. 1-2, 1963, pp. 38–42. Also, Gershov et al. discusses hydrazine-containing nickel-plating compositions in *Russian Engineering Journal*, Vol. 53, No. 10, pp. 73–74; and Vol. 58, No. 5, pp. 37–38. Yet another nickel-plating composition containing hydrazine is disclosed by Dini et al. in *Plating*, Vol. 54, Apr. 1, 1967, pp. 385–390. Furthermore, U.S. Pat. No. 3,915,716, issued to Haack, discloses a chemical nickel plating bath containing hydrazine or its salts. However, several important components may not be present in these prior art compositions. For example, they may not contain, in addition to the hydrazine, a complexing agent to complex free metal ions in the composition. Furthermore, they may not contain, in combination with hydrazine and the complexing agent, monoethanolamine, which can adjust the pH of the composition while also complexing the free metal ions. The exclusion of such components invariably results in at least one of several disadvantages when using the composition. For example, their use requires activation of the substrate, generally preceded by a series of rigorous cleaning steps, when plating on certain refractory metals, such as tungsten. Furthermore, some of these prior art baths are generally unstable under temperature conditions necessary for plating nickel directly onto nonactivated substrates of this type. Also, some of the prior art compositions require high organic amine-to-water ratios which, in addition to resulting in cost and safety concerns, do not allow nickel to be plated directly on tungsten or molybdenum substrates without prior activation of the substrates.

It is therefore an object of the present invention to provide a stable electroless nickel plating composition which allows nickel to be plated directly upon metal surfaces without prior activation of the surfaces.

It is yet another object of the present invention to provide a reliable and practical method of applying nickel directly to a nonactivated tungsten surface.

SUMMARY OF THE INVENTION

The foregoing objects have been achieved by the discovery of an aqueous electroless nickel plating composition comprising a water-soluble nickel salt; a hydrazine compound; monoethanolamine, and optionally comprising a water-soluble organic complexing agent. In preferred embodiments of the present invention, the nickel salt is nickel acetate; the complexing agent is a salt of ethylenediaminetetraacetic acid; and the weight ratio of water to monoethanolamine is from about 1:1 to about 19:1.

The plating composition of the present invention exhibits a high level of stability at temperatures which promote a high quality nickel layer to be applied to various metal surfaces at high plating rates.

Furthermore, the present invention encompasses a method of applying nickel directly to a nonactivated tungsten surface, comprising immersing the tungsten surface in the aqueous electroless nickel plating composition described above for a period of time sufficient to deposit on the tungsten surface a layer of nickel having a desired thickness. Unlike methods of the prior art, the present invention eliminates the necessity of activating the tungsten surface, e.g., by the deposition of palladium, prior to applying the nickel layer.

DETAILED DESCRIPTION OF THE INVENTION

The nickel plating composition of the present invention may be used to apply nickel to a variety of activated or nonactivated surfaces. For example, surfaces normally requiring activation by a catalytic substance like palladium, e.g., tungsten and molybdenum, may be nickel plated by the presently disclosed composition without such activation. Furthermore, this composition may be used to plate nickel on various other surfaces, such as platinum, gold and silicon.

The nickel metallization of metallized surfaces of a chip carrier is accomplished by use of the aqueous electroless nickel plating composition of this invention, without prior activation of the metallized surfaces. The bath comprises a water-soluble nickel salt, a hydrazine compound, and monoethanolamine (MEA), and may further include a water-soluble organic complexing agent.

MEA is selected for its capability of providing the joint functions of adjusting the pH of the plating bath, and also complexing nickel ions. An unexpected discovery of the present invention is that MEA is especially suitable as the amine component for electrolessly depositing nickel directly onto nonactivated metal surfaces according to the present invention. Amines other than MEA are generally unsuitable when the bath is used to plate nickel directly onto such surfaces. For example, diethanolamine or triethanolamine contribute to instability in the bath. Furthermore, ammonia and other primary amines such as methylamine are not practical for this use because they are too volatile to be incorporated into the plating bath.

The concentration of MEA in the composition of the present invention may range from about 2M to about 8M, and in preferred embodiments of the present invention, the weight ratio of water to monoethanolamine ranges from about 1:1 to about 19:1. Higher levels of monoethanolamine, i.e., above 50% by weight, are undesirable because they will not allow the bath to plate nickel directly onto tungsten or molybdenum surfaces without prior surface activation. Furthermore, monoethanolamine is a skin irritant and is moderately toxic, as well as being combustible.

The water-soluble nickel salt of the present invention is preferably nickel acetate or its hydrate. Other organic nickel salts might also be suitable. The concentration of the nickel salt may range from about 0.002M to about 0.6M.

When the bath of the present invention is to be used in a commercial setting requiring a very high degree of bath stability, a water-soluble organic complexing agent may be included therein, such as ethylenediaminetetraacetic acid tetrasodium salt. Other water-soluble complexing agents suitable for the present invention are described in U.S. Pat. No. 4,307,136, incorporated herein by reference. The concentration of the water-soluble complexing agent may range from about 0.1M to about 0.6M, with the preferred concentration being about 0.16M. The complexing agent may be omitted from the plating bath in those instances in which its complexing action is not required, e.g., when the level of monoethanolamine in the bath is sufficient to complex substantially all of the free nickel ions present in the bath.

The reducing agent of the present invention must be a hydrazine-containing compound when the substrate is formed from tungsten or molybdenum. Normally, such substrates are not catalytic toward oxidation of a reducing agent. As discussed above, such substrates require a time-consuming activation step prior to the deposition of nickel, which detracts from the efficiency of the nickel plating process. Although we do not wish to be bound by this theory, it appears that hydrazine, to the exclusion of all other reducing agents, e.g., amine boranes such as DMAB borohydrides; and hypophosphites, is highly amenable to the catalytic action of tungsten or molybdenum. The particular hydrazine-containing compound suitable for the present invention is not critical, with the proviso that the compound react in the bath to form free hydrazine. Illustrative compounds include hydrazine itself, hydrazine hydrate, hydrazine tartrate, hydrazine sulfate, and 2-hydroxyethylhydrazine. The concentration of the hydrazine compound in the bath of the present invention may range from about 0.1M to about 4M, with the preferred level being about 2M.

Table I describes a stable plating composition exemplary of the present invention, setting forth preferred concentrations for plating nickel directly onto a nonactivated metal surface which would normally require activation prior to such plating, e.g., a tungsten surface:

TABLE I

| Molar Concentration | Materials |
|---|---|
| 0.16 M | Nickel acetate tetrahydrate |
| 3.27 M | Monoethanolamine (MEA) |
| 2.00 M | Hydrazine monohydrate |
|  | Distilled water (sufficient volume for 1.0 liter of bath) |

The electroless plating baths of the present invention have a pH of from about 10 to about 13. The pH may be maintained within this range by any well-known method, e.g., the addition of an alkali metal hydroxide to raise the pH.

In preferred embodiments, the plating bath composition of the present invention is maintained at a temperature between about 70° C. and 100° C., and most preferably between about 93° C. and 97° C. Higher temperatures within the above-described range are desirable when higher plating rates are required. The plating bath composition of the present invention is highly stable throughout the abovedescribed temperature range, i.e., in the absence of foreign contamination, nickel particulates do not appear in the solution for at least 8 hours at the plating temperature. The addition of the water-soluble complexing agent described above results in especially high stability, i.e., nickel particulates do not appear for well over 8 hours.

The present invention also encompasses a method of applying nickel directly to a metal surface, especially the metal surfaces which normally require activation, such as those described above. The surface is immersed in an aqueous electroless nickel plating composition comprising a water-soluble nickel salt as described above; hydrazine; monoethanolamine; and, optionally, ethylenediaminetetraacetic acid; for a period of time sufficient to deposit on the metal surface a layer of nickel. The nickel layer typically has a thickness of between about 2 microns and 5 microns.

In practicing the method of the present invention, the plating bath generally described above is contained in a vessel made of material inert to the plating chemicals, e.g., a plastic vessel such as polypropylene. The plating bath is heated to maintain the temperature between about 70° C. and 100° C. Stirring of the bath provides both chemical homogeneity and uniform plating solution temperatures. The substrate surface is maintained in motion, e.g., by rotation, to dislodge gas bubbles which can adhere to the substrate surface and decrease the amount of plating composition in contact with the surface, thereby reducing plating efficiency.

When the composition listed in Table I, at a pH of about 12 and a temperature of about 95° C., is used to deposit nickel on a tungsten substrate, the rate of nickel deposition is approximately 15 microns per hour. It will be apparent to those skilled in the art that many adjustments can be made in carrying out this method, depending on the particular substrate used, the desired thickness, the desired rate of deposition, etc. Some of these adjustments include increasing or decreasing pH, bath temperature, or level of complexing agent. For example, when the bath of Table I is maintained at a pH of about 12, the rate of nickel deposition on a tungsten substrate is about 6 microns per hour at 85° C.; 11 microns per hour at 90° C.; and 15 microns per hour at 95° C. Nickel applied to a substrate using the method and composition of the present invention is bright gray and dense, i.e., substantially free of porosity.

The invention of the present application will be more fully understood by reference to the following examples.

EXAMPLE 1

A tungsten-metallized ceramic chip carrier having 0.71 cm$^2$ of exposed tungsten was nickel-plated for 20 minutes in 50 ml of a plating bath composition within the scope of the present invention. The bath contained:
35.0 ml: water
2.0 g: nickel acetate tetrahydrate
10.1 g: MEA
4.9 ml: hydrazine monohydrate.
The bath was maintained at a pH of 11.6 and a temperature of about 85° C. The chip carrier was washed in methanol to remove any handling contamination and then dried prior to plating. The tungsten surface was nonactivated.

The weight gain of the carrier after plating was 1.23 mg., which is equivalent to a nickel thickness of 1.94 microns. The equivalent plating rate was 5.82μ/hour. The nickel layer was bright gray and dense.

EXAMPLE 2

A chip carrier similar to that of Example 1 was washed, dried, and immersed in the bath of Example 1 for 20 minutes under the same conditions, except that the bath temperature was maintained at 90° C.

The weight gain of the carrier after plating was 2.32 mg., corresponding to a nickel thickness of 3.66 microns and a plating rate of about 11.0 microns per hour.

The appearance of the nickel layer was bright gray.

EXAMPLE 3

Example 2 was repeated while the bath temperature was 95° C. The weight gain of the carrier after plating was 3.00 mg., corresponding to a nickel thickness of 4.06 microns and a plating rate of 14.6 microns per hour.

The appearance of the nickel layer was bright gray.

Furthermore, the bath bf Examples 1–3 exhibited a high level of stability, i.e., there were no nickel flakes present for at least eight hours.

EXAMPLE 4

A tungsten-metallized ceramic chip carrier was first activated with palladium by immersion in a 0.007 weight percent palladium chloride solution for 30 seconds. The carrier was then dried and placed in the nickel-plating bath of Examples 1–3 for 20 minutes at a temperature of 80° C.

The weight gain of the carrier after plating was 1.66 mg., corresponding to a thickness of 2.62 microns and a plating rate of 7.85 microns per hour.

The appearance of the nickel layer was bright gray.

EXAMPLE 5

Example 4 was repeated at a temperature of 90° C. The weight gain of the carrier was 2.11 mg., corresponding to a thickness of 3.33 microns and a plating rate of about 10 microns per hour.

The appearance of the nickel layer was bright gray.

EXAMPLE 6

Example 5 was repeated at a temperature of 95° C. The weight gain of the carrier was 2.96 mg., corresponding to a thickness of 4.66 microns and a plating rate of about 14 microns per hour.

EXAMPLE 7

Three tungsten-metallized unactivated chip carriers 7(a), 7(b), and 7(c) of the type used in Example 1 were nickel-plated for 10 minutes in a bath within the scope of the present invention containing:
81.0 g: water
4.0 g: nickel acetate tetrahydrate
15.0 g: MEA
4.0 ml: hydrazine monohydrate
Carrier 7(a) was nickel-plated at 90° C.; carrier 7(b) at 92° C., and carrier 7(c) at 95° C. A bright, uniform nickel layer was evident on the tungsten metallization of each carrier.

EXAMPLE 8

An unactivated chip carrier like that of Example 1 was nickel-plated for 25 minutes in a bath within the scope of the present invention containing:
50.0 g: water
4.0 g: nickel acetate tetrahydrate
50.0 g: MEA
4.0 ml: hydrazine monohydrate.
The bath temperature was 92° C. A bright, uniform nickel layer was evident on the tungsten metallization. The equivalent thickness of nickel, based on weight gain, was about 2 microns.

EXAMPLE 9

An unactivated chip carrier like that of Example 1 was nickel-plated for 10 minutes in a bath within the scope of the present invention containing:
70.0 g: water
4.0 g: nickel acetate tetrahydrate
20.0 g: MEA
9.8 ml: hydrazine monohydrate
5.3 g: Tetrasodium salt of EDTA.
The bath temperature was 95° C. The nickel layer was uniform and bright in appearance.

EXAMPLE 10

An unactivated chip carrier like that of Example 1 was nickel-plated for 15 minutes in a bath composition within the scope of the present invention containing:
70.0 g: water
0.4 g: nickel acetate tetrahydrate
20.0 g: MEA
9.8 ml: hydrazine monohydrate.
The bath temperature was 95° C. The equivalent nickel thickness was 0.40 microns, and the nickel was bright and uniform in appearance.

EXAMPLE 11

An unactivated chip carrier like that of Example 1 was nickel-plated for 6 minutes in a bath composition within the scope of the present invention containing:
70.0 g: water
8.4 g: nickel acetate tetrahydrate
20.0 g: MEA
10.0 ml: hydrazine monohydrate.
The bath temperature was 95° C. The equivalent nickel thickness was 0.28 microns, and the nickel layer was bright and uniform in appearance.

While the invention has been described with respect to preferred embodiments, it will be apparent that certain modifications and changes can be made without departing from the spirit and scope of the invention and, therefore, it is intended that the foregoing disclosure be limited only by the claims appended hereto.

What is claimed is:

1. A method of applying nickel directly to a nonactivated tungsten surface by immersing the tungsten surface in an aqueous electroless nickel plating bath comprising a water-soluble nickel salt; ethylenediaminetetraacetic acid; hydrazine; and monoethanolamine at a temperature of about 70° C. to 100° C. for a period of time sufficient to deposit a layer of nickel on the tungsten surface.

2. The method of claim 1 wherein the weight ratio of water to monoethanolamine is from about 1:1 to about 19:1.

3. The method of claim 2 wherein the tungsten surface is maintained in motion while immersed in the bath.

* * * * *